(12) United States Patent
Nakashiba

(10) Patent No.: US 7,619,296 B2
(45) Date of Patent: Nov. 17, 2009

(54) CIRCUIT BOARD AND SEMICONDUCTOR DEVICE

(75) Inventor: Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 375 days.

(21) Appl. No.: 11/340,682

(22) Filed: Jan. 27, 2006

(65) Prior Publication Data

US 2006/0170072 A1    Aug. 3, 2006

(30) Foreign Application Priority Data

Feb. 3, 2005    (JP)    ............................... 2005-027298

(51) Int. Cl.
*H01L 29/00*    (2006.01)
(52) U.S. Cl. .................. 257/531; 257/723; 257/724; 361/782; 361/783
(58) Field of Classification Search ................ 257/723, 257/724, 783, 531; 361/782, 783
See application file for complete search history.

(56) References Cited

U.S. PATENT DOCUMENTS 5,450,263 A * 9/1995 Desaigoudar et al. ....... 360/110
7,038,294 B2 * 5/2006 Ma et al. ..................... 257/528
7,348,654 B2 * 3/2008 Hsieh et al. .................. 257/528
7,355,290 B2 * 4/2008 Shioga et al. ............... 257/790
2003/0141919 A1 * 7/2003 Wang et al. .................. 327/390
2005/0160575 A1 * 7/2005 Gambino et al. ........... 29/602.1

FOREIGN PATENT DOCUMENTS

| JP | 10-335590 | 12/1998 |
|---|---|---|
| JP | 11-340420 | 12/1999 |
| JP | 2002-124638 | 4/2002 |
| JP | 2004-274463 | 9/2004 |

* cited by examiner

*Primary Examiner*—Phuc T Dang
(74) *Attorney, Agent, or Firm*—Young & Thompson

(57) ABSTRACT

A semiconductor device, includes: a semiconductor substrate; a multilayered interconnect structure formed on the semiconductor substrate; a terminal for flip-chip packaging arranged on the surface of the multilayered interconnect structure; and a spiral inductor formed to enclose the terminal for flip-chip packaging, in a plan view, which is not electrically connected with the spiral inductor. The spiral inductor may be provided for peaking by which the gain reduction caused in a high frequency is compensated.

20 Claims, 14 Drawing Sheets

CIRCUIT BOARD AND SEMICONDUCTOR DEVICE

This application is based on Japanese Patent application NO. 2005-027298, the content of which is incorporated hereinto by reference.

BACKGROUND

1. Technical Field

The present invention relates to a circuit board, and a semiconductor device, which include an inductor.

2. Related Art

FIG. 14 is a view showing a differential amplification circuit disclosed in Japanese Laid-open patent publication NO. 2004-274463. The differential amplification circuit includes: a current-controlled transistor 3; a single pair of active transistors 2a and 2b; a load resistances 1a and 1b; and load inductors 11a and 11b. The sources of active transistors 2a and 2b are connected to the drain of the current-controlled transistor 3, respectively. The load resistances 1a and 1b are connected to the drains of the active transistors 2a and 2b, respectively. One end of the load resistance 1a is connected to the load resistance 1a. One end of the load inductor 11b is connected to the load resistance 1b. The source of the current-controlled transistor 3 is connected to a negative voltage terminal 8. The gate of the current-controlled transistor 3 is fixed to a constant voltage through a current-controlled terminal 6. An input terminal 4a is connected to the gate of the active transistor 2a, and an input terminal 4b is connected to the gate of the active transistor 2b. An input signal in opposite phase is impressed to the input terminals 4a and 4b, and the current passing through the drain is controlled according to the input signal. The other ends of the load inductors 11a and 11b are connected to a positive voltage terminal 7.

Though a phenomenon in which a gain is reduced in a high frequency is caused in such a differential amplification circuit, the gain reduction is prevented by introducing the load inductors 11a and 11b beforehand for increase in the load impedance, wherein the increase is based on use of a phenomenon in which an impedance is increased in a high frequency in load inductors.

In the Japanese Laid-open patent publication NO. H11-340420, there has been disclosed a configuration in which a region for bump connection is provided in an end section located in the center portion of a spiral inductor in a swirling pattern.

In the Japanese Laid-open patent publication NO. 2002-124638, there has been disclosed a semiconductor device with a configuration in which a pad, by which an aluminum interconnect and the external terminals or the like are electrically connected to each other, is formed in a semiconductor integrated circuit, and a high frequency signal passes through the pad. This semiconductor device has a configuration in which a metal coil is integrally formed into the pad in such a way that the metal coil is connected to a parasitic capacity existing between the pad and a semiconductor substrate, which is the base of the semiconductor integrated circuit, in parallel, and the metal coil is located between the pad and the semiconductor substrate; and the parasitic capacity and the coil forms a resonance circuit with a resonance frequency corresponding to the high frequency signal.

In the Japanese Laid-open patent publication NO. H10-335590, there has been disclosed a passive device circuit with a configuration in which thin film capacitors with a high dielectric constant, a spiral inductor, a ground via-hole, and a bonding pad are included, and the two thin film capacitors with a high dielectric constant which are continuously connected to each other, the via hole, and the bonding pad are arranged at the center of the spiral inductor. Here, the bonding pad is an extraction portion of the spiral inductor. All of Japanese Laid-open patent publication NOS. H11-340420, 2002-124638, and H10-335590 have a configuration in which the pad provided in one end of the spiral inductor is arranged at the center of the spiral inductor.

However, a high peaking amount making up for signal attenuation is required because the signal attenuation caused by the parasitic capacity in the circuits is increased when a required operating frequency is high. Thereby, there has been caused a problem that an area occupied by the load inductors 11a and 11b is increased in the semiconductor integrated circuit because the inductances of the load inductors 11a and 11b shown in FIG. 14 are required to be increased.

Moreover, there has been further another problem that the area of the semiconductor integrated circuit is increased because a large number of circuits are formed in the semiconductor integrated circuit, and a large number of load inductors are required when a load inductor is installed into each circuit.

SUMMARY OF THE INVENTION

According to the present invention, there is provided a semiconductor device, including: a semiconductor substrate; a multilayered interconnect structure formed on the semiconductor substrate; a terminal for flip-chip packaging arranged on the surface of the multilayered interconnect structure; and a spiral inductor formed to enclose the terminal for flip-chip packaging, in a plan view, which is not electrically connected with the spiral inductor.

According to the above configuration, the flip-chip packaging terminal is configured to be formed in a dead space of the spiral inductor to realize space-saving.

Moreover, the spiral inductor is introduced for peaking by which the gain reduction caused in a high frequency is compensated according to the semiconductor device or the circuit board of the present invention. Therefore, the spiral inductor according to the present invention does not require such a high Q value that an inductor in a resonance circuit of a microwave monolithic integrated circuit (MMIC) for impedance matching requires. Accordingly, the gain reduction of the semiconductor device or the circuit board may be compensated by the spiral inductor even under a state in which the spiral inductor is formed so that the spiral inductor encloses at least one flip-chip packaging terminal.

The semiconductor device or the circuit board according to the present invention may further include a plurality of terminals for flip-chip packaging including the terminal for flip-chip packaging which is enclosed by the spiral inductor, wherein the plurality of terminals for flip-chip packaging are arranged on the surface of the substrate in a plan view.

According to the semiconductor device or the circuit board of the present invention, increase in the space can be suppressed even when a number of the spiral inductors are provided, and the size of the circuit board can kept small.

In the semiconductor device or the circuit board according to the present invention, the above-described substrate includes a semiconductor substrate, and a multilayered interconnect structure formed thereon. Here, the semiconductor device including the semiconductor substrate and the multilayered interconnect structure may be configured to function as, for example, a differential amplification circuit.

In the present invention, the spiral inductor is introduced for peaking by which the gain reduction of the semiconductor device caused in a high frequency is compensated. Therefore, the gain reduction of the semiconductor device may be compensated by the spiral inductor even under a state in which the spiral inductor is formed so that the spiral inductor encloses flip-chip packaging terminal.

Moreover, in the circuit board according to the present invention, a plurality of through electrodes are provided in the substrate and one end of each of which is serves as the terminal for flip-chip packaging, the spiral inductor being connected to one of the through electrodes.

Here, a spacer may be used as, for example, an interposer to realize flip-chip packaging of an IC chip and the like thereon. In this case, the gain reduction of the IC chip in a high frequency may be compensated because the spiral inductor is formed in the spacer.

According to the present invention, space saving of the circuit board and the semiconductor device, which include an inductor, may be realized.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments according to the present invention will be explained, referring to drawings. Here, same components are denoted by the same reference numbers in all drawings, and detailed explanation will not be repeated.

First Embodiment

In the present embodiment, a circuit board is a semiconductor device. In the embodiment, a substrate includes a semiconductor substrate, and a multilayered interconnect structure formed thereon. Moreover, a terminal for flip-chip packaging (hereinafter referred to as a flip-chip packaging terminal as well) is a pad for flip-chip packaging (hereinafter referred to as a flip-chip packaging pad as well). A semiconductor device 100 according the embodiment may be configured to function as a differential amplification circuit shown in above-described drawing 14.

Figure 1:
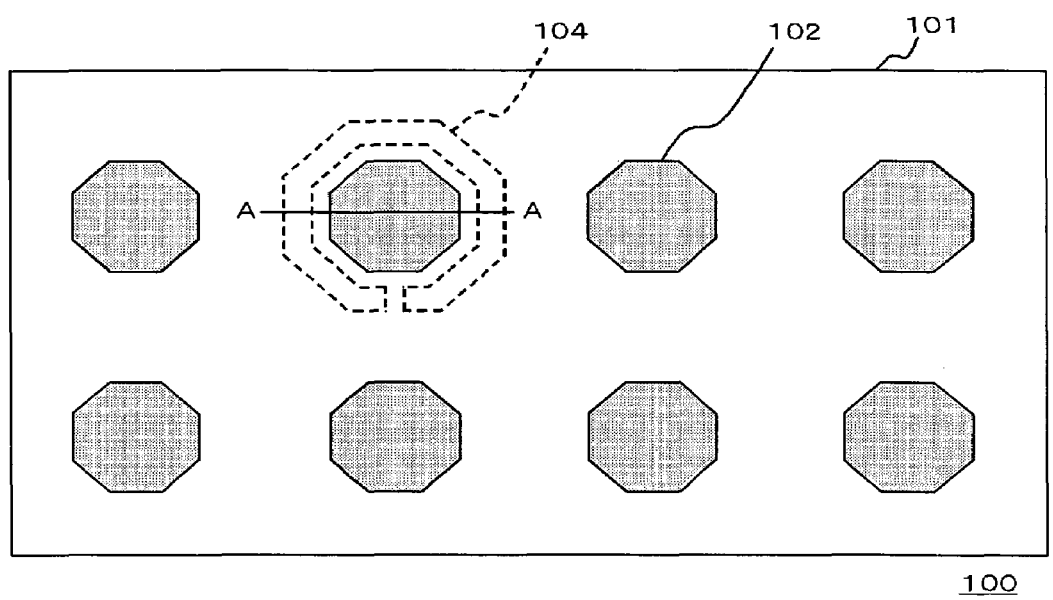
FIG. 1 is a top view showing a configuration of a semiconductor device according to an embodiment.

FIG. 1 is a top view showing a configuration of the semiconductor device according to the embodiment.

The semiconductor device 100 includes: a substrate 101; a plurality of flip-chip packaging pads 102 plane-arranged on the surface of the substrate 101; and a spiral inductor 104 formed so that the inductor 104 encloses one of the flip-chip packaging pads 102 in a plan view. Here, the plurality of flip-chip packaging pads 102 is arranged in a matrix. The flip-chip packaging pad 102 enclosed by the spiral inductor 104 is not electrically connected with that the spiral inductor 104.

Figure 2:
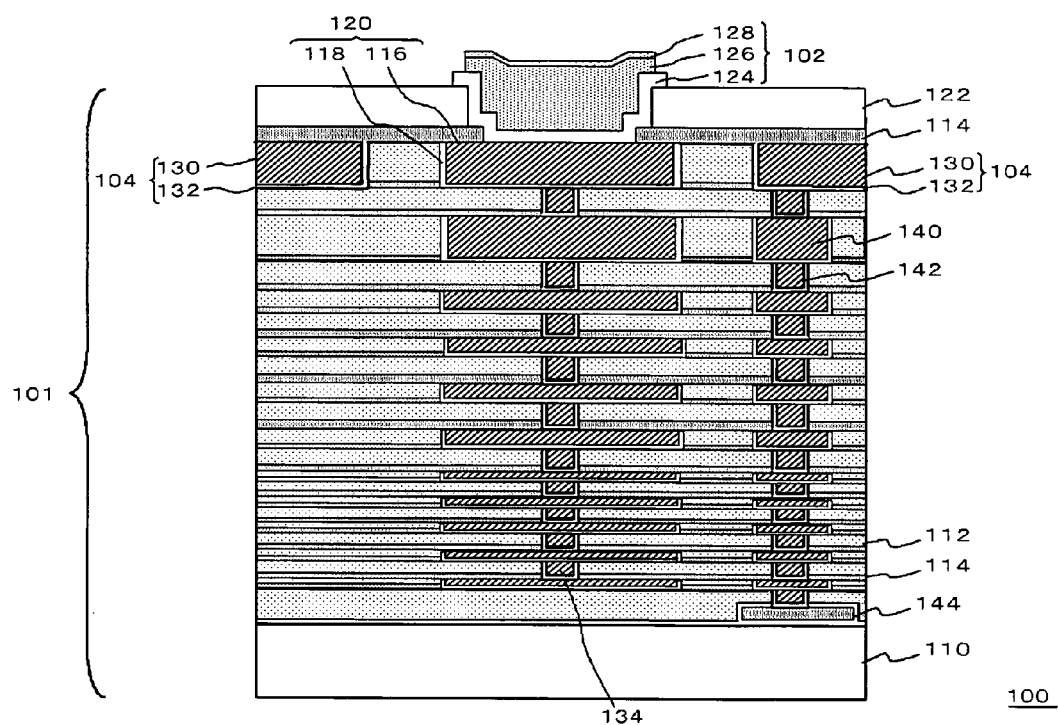
FIG. 2 is a cross-sectional view taken along the A-A line in FIG. 1.

FIG. 2 is a cross-sectional view taken along the A-A line in FIG. 1.

The substrate 101 includes a semiconductor substrate 110, and a multilayered interconnect structure formed thereon. Here, the multilayered interconnect structure is a stacked structure of insulating interlayers 112 and diffusion barriers 114. within the insulating interlayers 112, interconnects 120 and via plugs 134 are alternately arranged. The interconnects 120 include an interconnect metal layer 116 having, for example, copper, and a barrier metal layer 118. Moreover, the flip-chip packaging pad 102 is formed on the top-layer interconnect 120. A polyimide layer is formed on the top-layer diffusion barrier 114. The flip-chip packaging pad 102 is formed with a barrier metal film 124, a metal layer 126 having, for example, copper, and a diffusion barriers 128. Moreover, the spiral inductor 104 is formed in the same layer in which the top-layer interconnect 120 is formed. The spiral inductor 104 is formed with a metal film 130 including, for example, copper, and a barrier metal layer 132.

Moreover, resistance 144 is formed in the lower layer of the multilayered interconnect structure. For example, the resistance 144 may be formed with polysilicon. The spiral inductor 104 and the resistance 144 are electrically connected to each other through interconnects 140 and via plugs 142. Though the above-described example has had a configuration in which the resistance 144 is formed in the lower layer of the multilayered interconnect structure, the resistance 144 may be formed in any portion of the multilayered interconnect structure.

Figure 14:
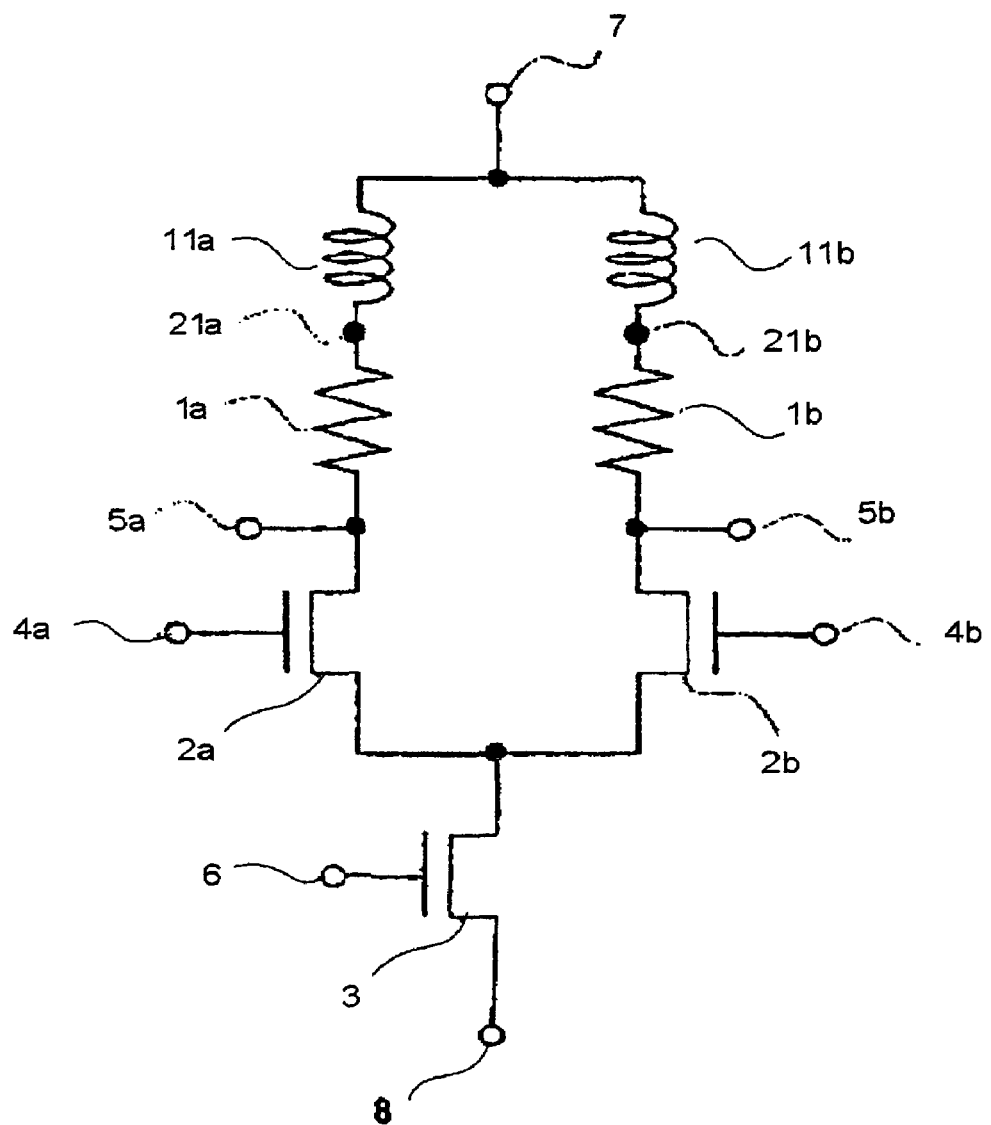
FIG. 14 is a view showing a differential amplification circuit.

Here, for example, the spiral inductor 104 corresponds to the load inductor 11a or 11b in FIG. 14, and the resistance 144 corresponds to the load resistance 1a or 1b in FIG. 14. A transistor which is not shown in FIG. 2 is formed on the semiconductor substrate 110, and is connected to the resistance 144. In the embodiment, the spiral inductor 104 is introduced for peaking by which the gain reduction of the semiconductor device 100 is compensated wherein the gain reduction is caused in a high frequency. Therefore, the spiral inductor 104 does not require such a high Q value that an inductor in a resonance circuit for impedance matching requires. Accordingly, the circuit elements such as the interconnects 140, the via plugs 142, and the resistance 144 can be arranged just under the spiral inductor 104 in the embodiment. Moreover, the gain reduction of the semiconductor device 100 may be compensated by the spiral inductor 104 even under a state in which the spiral inductor 104 is arranged so that the inductor 104 encloses one flip-chip packaging pad 102.

Figure 3:
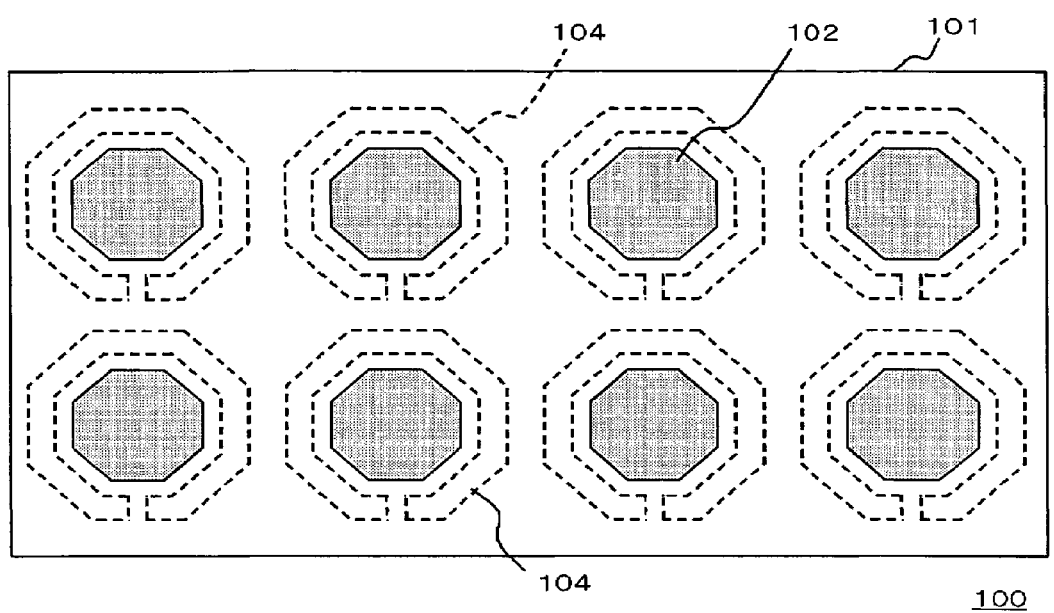
FIG. 3 is a top view showing another configuration of the semiconductor device according to the embodiment.

FIG. 3 is a top view showing another configuration of the semiconductor device 100 according to the embodiment.

Here, the semiconductor device 100 includes a plurality of spiral inductors 104 formed so that each of spiral inductors 104 encloses each of plurality of flip-chip packaging pads 102 in a plan view. In this case as well, a substrate 101 includes a semiconductor substrate 110, and a multilayered interconnect structure formed thereon, in a similar manner to that of FIG. 2.

According to the semiconductor device 100 of the embodiment, space-saving may be realized because the plurality of spiral inductors 104 are formed so that each of the spiral inductors 104 encloses one flip-chip packaging pad 102 in a plan view. Therefore, increase in the space can be suppressed to less even when a number of the spiral inductors 104 are provided as shown in FIG. 3, and there may be realized a configuration in which a number of spiral inductors 104 are included while the size of the semiconductor device 100 is kept small.

Figure 4:
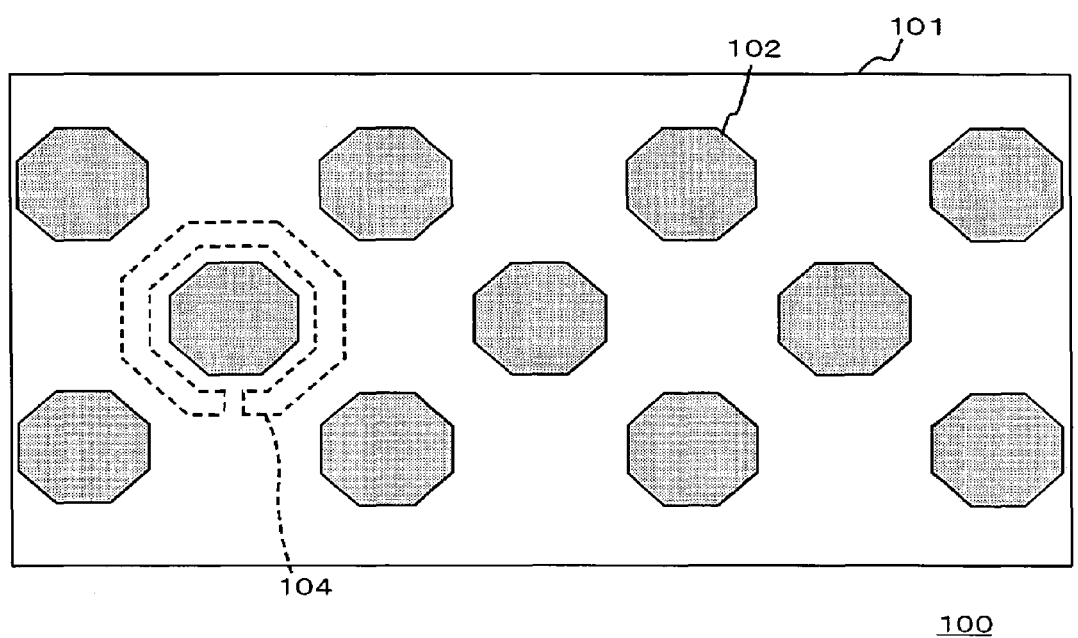
FIG. 4 is a top view showing still another configuration of the semiconductor device according to the embodiment.

Hereinafter, various kinds of variants of the semiconductor device 100 will be explained. FIG. 4 is a top view showing still another configuration of the semiconductor device according to the embodiment.

Here, a plurality of flip-chip packaging pads 102 is arranged in a zigzag pattern. In this configuration as well, a configuration including a plurality of spiral inductors 104 may be realized as shown in FIG. 3. Thus, a plurality of flip-chip packaging pads 102 may be arranged in any pattern.

Figure 5:
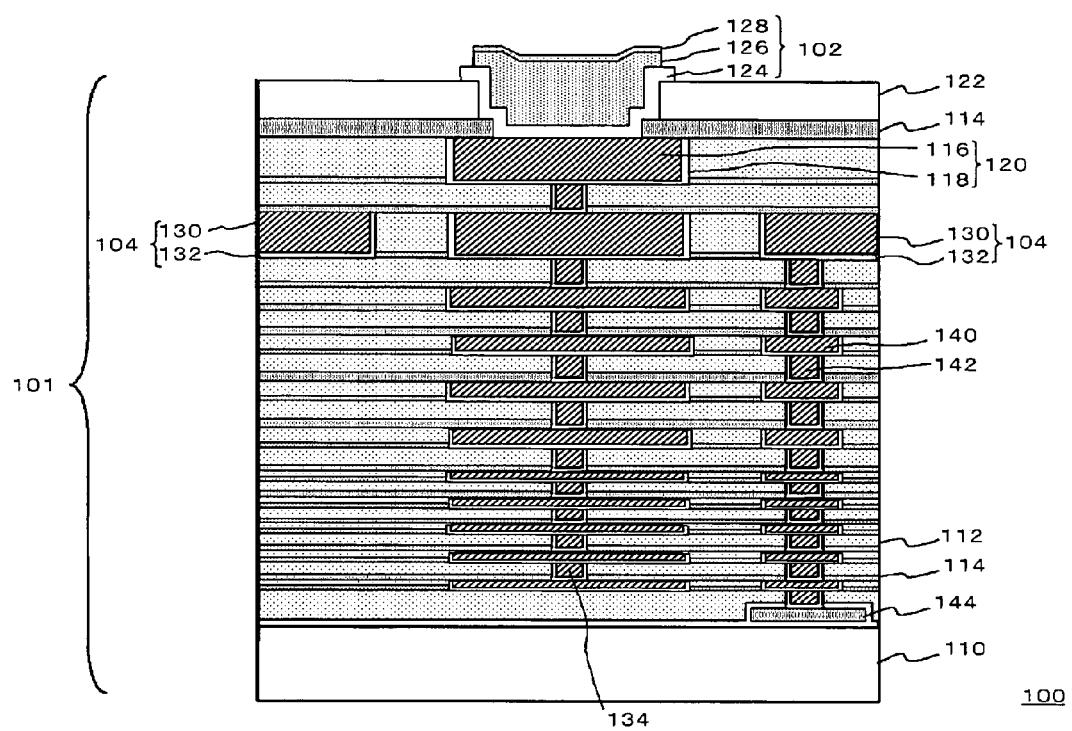
FIG. 5 is an another example of a cross-sectional view taken along the A-A line in FIG. 1.

FIG. 5 is another example of a cross-sectional view taken along the A-A line in FIG. 1. Here, this example is different from that of FIG. 2 in a point that a layer in which the spiral inductor 104 is formed is not the same layer as the top-layer interconnect 120. As is described, the spiral inductor 104 may be formed in any layer of the multilayered interconnect structure.

Figure 6:
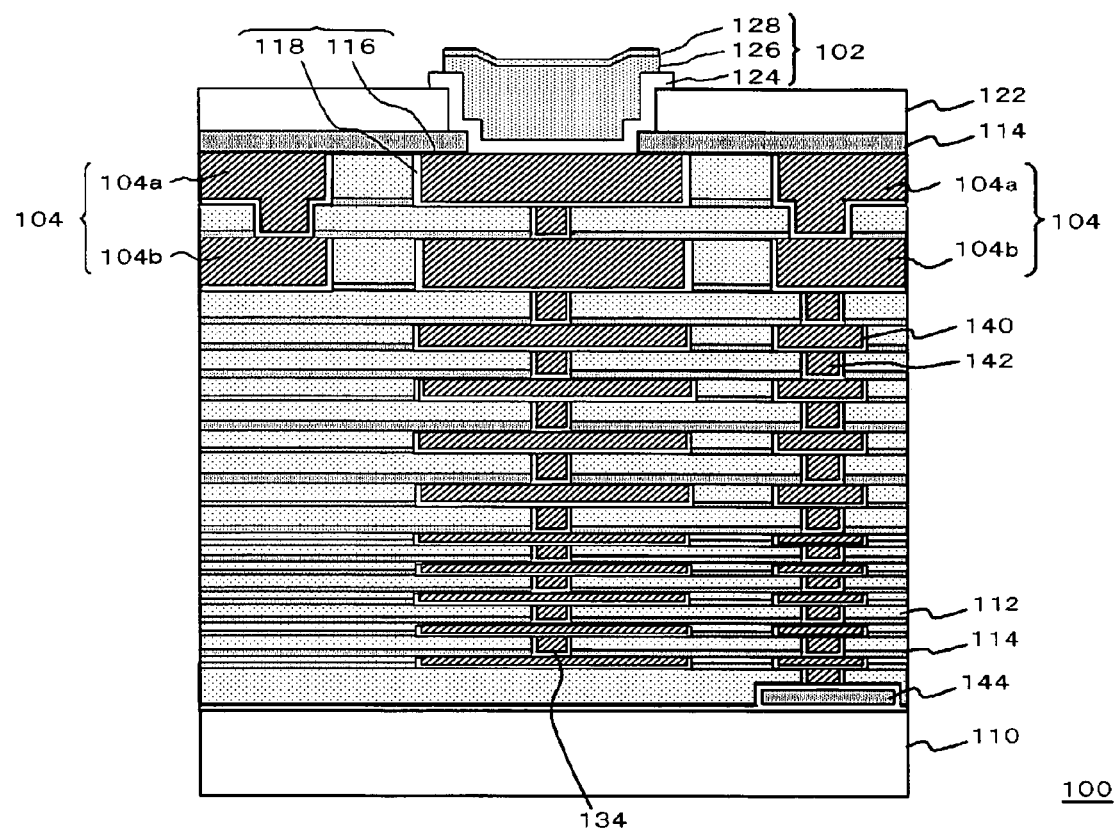
FIG. 6 is an another example of a cross-sectional view taken along the A-A line in FIG. 1.

FIG. 6 is still another example of a cross-sectional view taken along the A-A line in FIG. 1. Here, this example is different from those of FIG. 2 and FIG. 5 in a point that the spiral inductor 104 is formed over a plurality of layers. Here, the spiral inductor 104 is formed over two layers. The spiral inductors 104a and 104b are formed in each layer, and are connected to each other. Thereby, the resistance of the spiral inductor 104 may be reduced. Furthermore, the spiral inductor 104 may be formed over equal to or more than three layers, though FIG. 6 has shown an example in which the spiral inductor 104 is formed over two layers.

Figure 7:
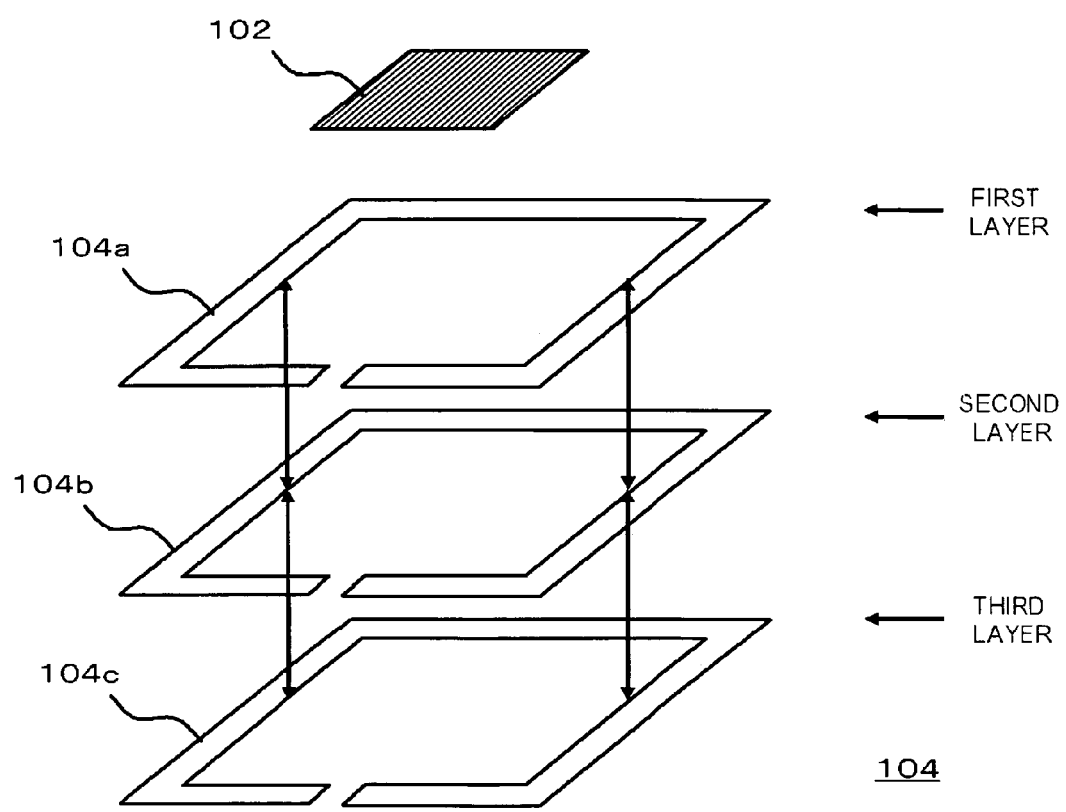
FIG. 7 is a view showing a state in which a spiral inductor is formed over three layers, and spiral inductors in respective layers are connected to one another.

FIG. 7 is a view showing an example for a state in which the spiral inductor 104 is formed over three layers of spiral inductors 104a, 104b, and 104c, and the spiral inductors 104a, 104b, and 104c are connected to one another. Here, the spiral inductor 104a of a first layer, the spiral inductor 104b of a second layer, and the spiral inductor 104c of a third layer are formed in this order from the above, and the spiral inductors 104a and 104b are connected at two points, and the spiral inductors 104b and 104c are also connected at two points. Thus, the resistance of the spiral inductor 104 may be reduced because the spiral inductors 104a through 104c formed over a plurality of layers are connected in parallel.

Figure 8:
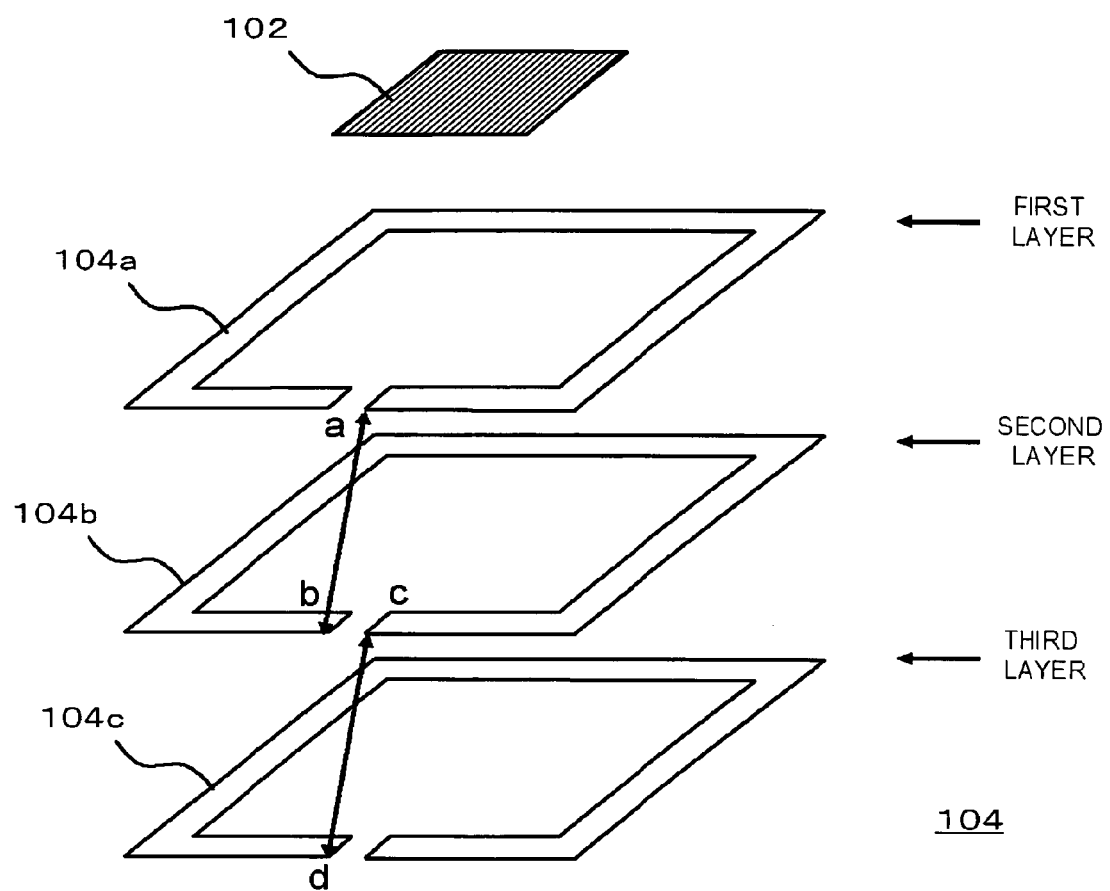
FIG. 8 is a view showing another state in which a spiral inductor is formed over three layers, and spiral inductors in respective layers are connected to one another.

FIG. 8 is a view showing another example for a state in which the spiral inductor 104 is formed over three layers of spiral inductors 104a, 104b, and 104c, and the spiral inductors 104a, 104b, and 104c are connected to one another. In this example, one end "a" of the spiral inductor 104a of a first layer and the other end "b" of the spiral inductor 104b of a second layer are connected to each other, and one end "c" of the spiral inductor 104b of the second layer and the other end "d" of the spiral inductor 104c of a third layer are connected to each other. Thereby, the spiral inductor 104 forms a spiral coil. Thus, the inductance of the spiral inductor 104 may be appropriately changed by connecting a plurality of spiral inductors 104a through 104c, which are formed in a layer different from one another, in series and in a spiral pattern.

According to the above configuration, space-saving may be realized when the spiral inductors 104 with a large inductance are arranged.

Figure 9:
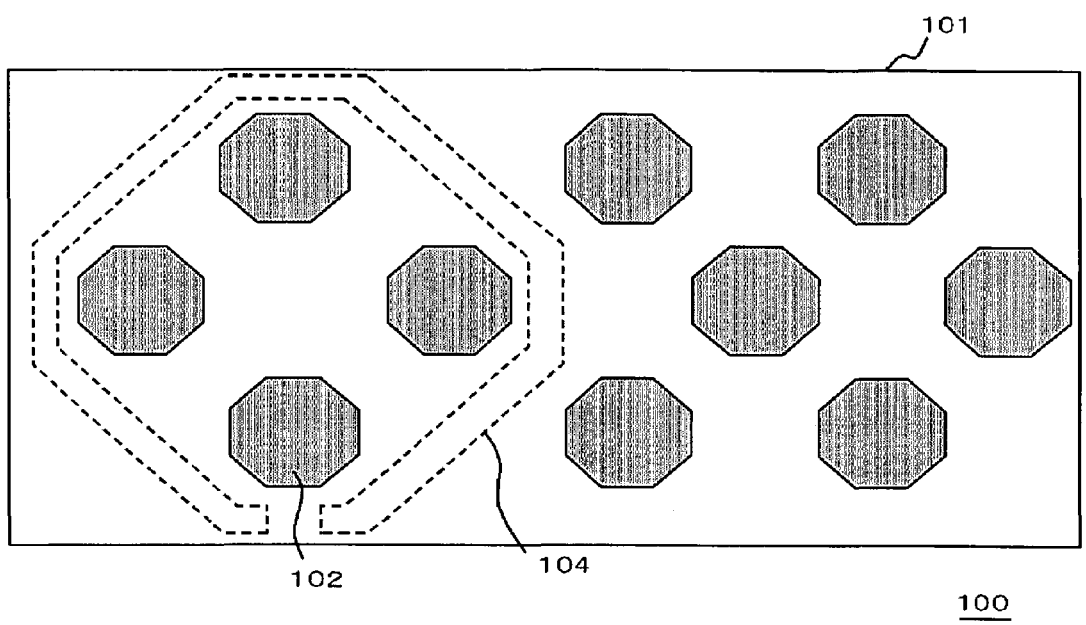
FIG. 9 is a top view showing another configuration of the semiconductor device according to the embodiment.
Figure 10:
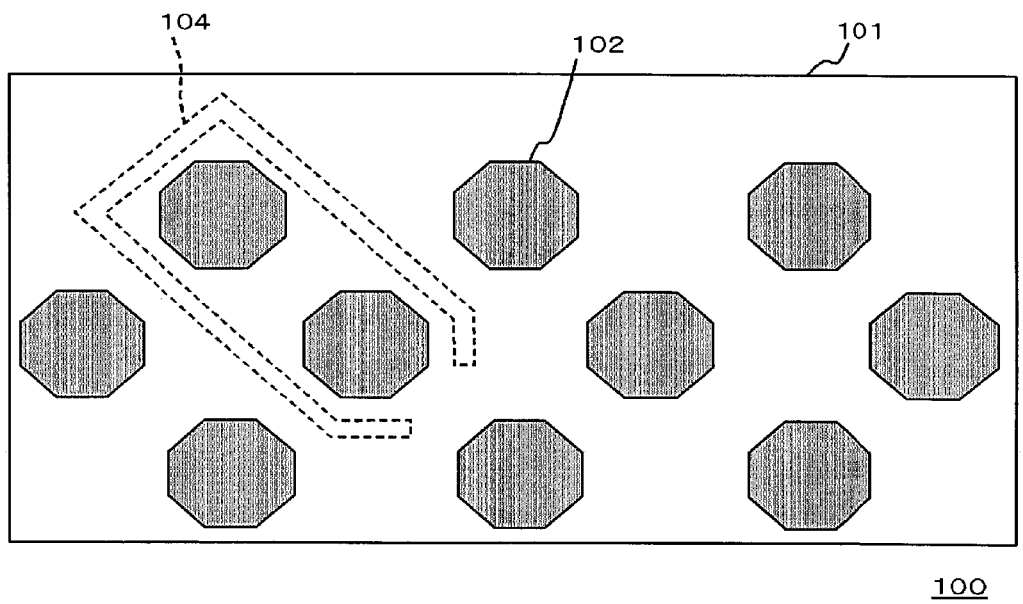
FIG. 10 is a top view showing still another configuration of the semiconductor device according to the embodiment.
Figure 11:
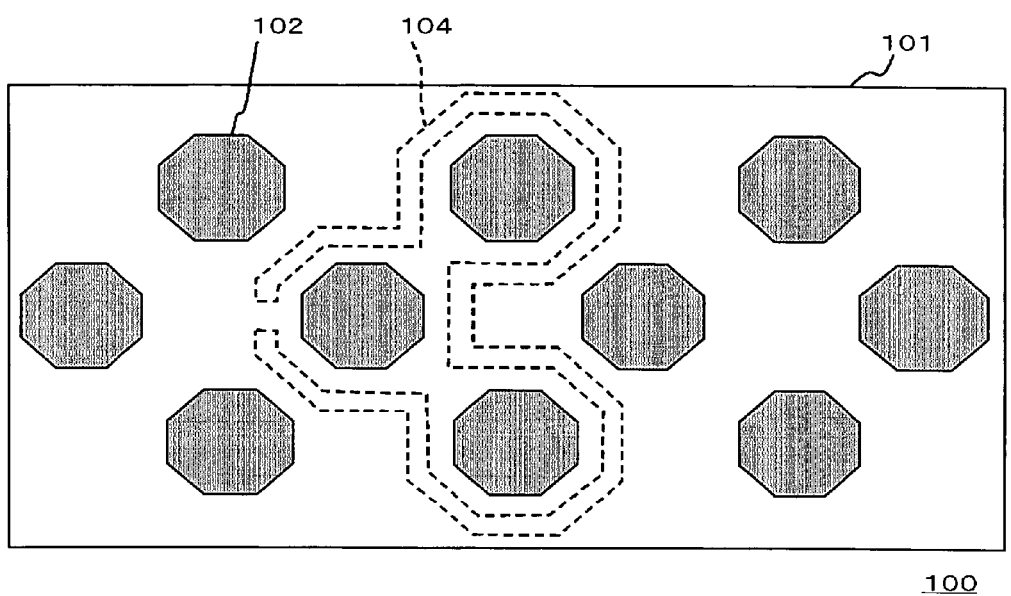
FIG. 11 is a top view showing still different configuration of the semiconductor device according to the embodiment.

Each of FIG. 9, FIG. 10, and FIG. 11 is a top view showing another example of the semiconductor device 100 according to the embodiment. Here, the spiral inductor 104 is formed so that the spiral inductor 104 encloses a plurality of pads 102 in a plan view. As is described, the spiral inductor 104 may have a various kinds of configurations, and the spiral inductor 104 is formed so that the spiral inductor 104 encloses a desired number of flip-chip packaging pads 102 in a plan view. Although only one spiral inductor 104 is shown in the above examples, these examples may have a configuration in which the semiconductor device 100 has a plurality of the spiral inductors 104.

Here, among the plurality of flip-chip packaging pads 102, some pads are connected to a signal line on which a signal is transmitted, and other pads are connected to a power supply line or to the earth line in the above-described embodiments. The spiral inductor 104 may be electrically connected to the flip-chip packaging pad 102 not enclosed thereby and connected to the power supply line, or the earth line in the multilayered interconnect structure of the substrate 101.

The semiconductor device 100 according to the embodiment may have a configuration in which the flip-chip packaging pad 102 is formed in a dead space of the spiral inductor 104. Accordingly, space-saving may be realized.

Second Embodiment

In the present embodiment, a circuit board is a spacer having a plurality of through electrodes. In the embodiment, one end of the through electrode serves as a flip-chip packaging terminal.

Figure 12A:
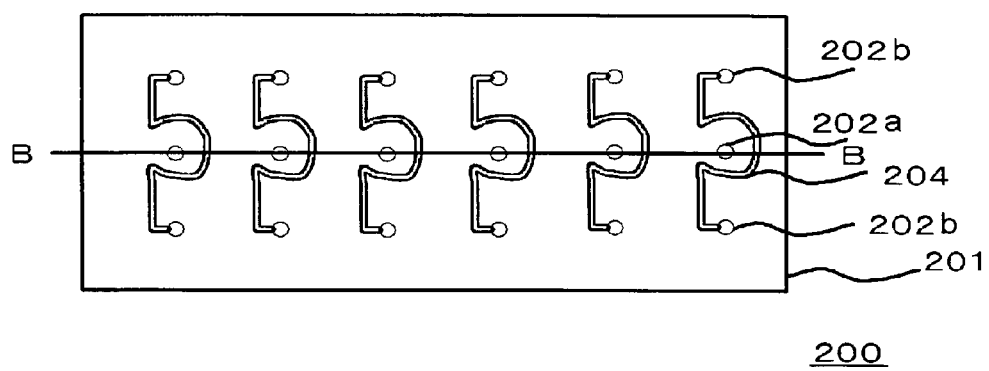
FIG. 12A is a top view of a spacer according to an embodiment.
Figure 12B:
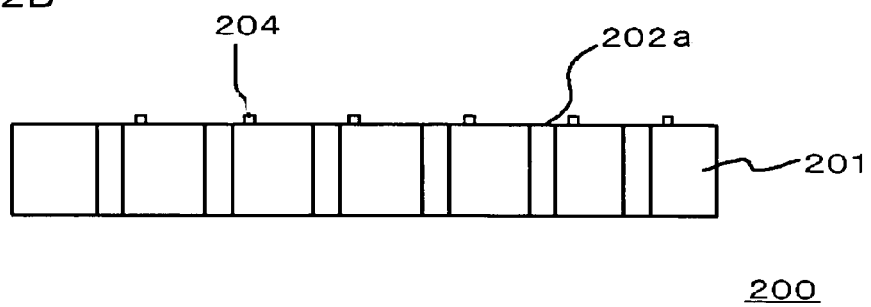
FIG. 12B is a cross-sectional view taken along the B-B line in FIG. 12A.

FIG. 12A and FIG. 12B are views showing a configuration of the spacer according to the embodiment. FIG. 12A is a top view of the spacer, and FIG. 12B is a sectional view taken along the B-B line in FIG. 12A.

A spacer 200 includes: a substrate 201; a plurality of through electrodes 202a and 202b each of which has one end plane-arranged on the surface of the substrate 201; and a plurality of spiral inductors 204 which are formed so that each of the spiral inductors 204 encloses one of the plurality of through electrodes 202a. The substrate 201 may be, for example, a glass substrate, or a silicon substrate. In the embodiment, both ends of each spiral inductor 204 are connected to any one of the through electrodes 202b. However, the through electrode 202a enclosed in the spiral inductor 204 is not connected to the spiral inductor 204. Both ends of the spiral inductor 204 are connected to any one of the through electrodes 202a and 202b which are different from through electrodes 202a enclosed in the spiral inductor 204 itself.

The substrate 201 may be formed of, for example, a non-conducting or insulating material such as glass. In the embodiment, the spiral inductor 204 may be electrically connected to another circuit element through the through electrode 202b because the spiral inductor 204 is connected to the through electrode 202b. In another example, the substrate 201 may be a silicon substrate.

The spacer 200 according to the embodiment may be used as, for example, an interposer to realize flip-chip packaging of an IC chip and the like thereon. In this case, the gain reduction of the IC chip in a high frequency may be compensated because the spiral inductor 204 is formed in the spacer 200.

Figure 13:
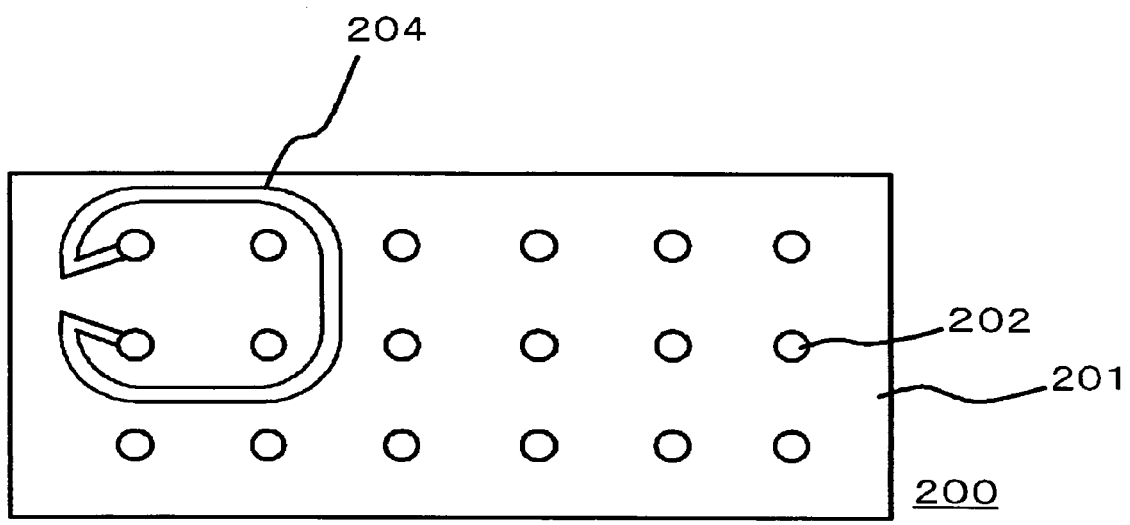
FIG. 13 is a top view showing still another configuration of the semiconductor device according to the embodiment.

FIG. 13 is a top view showing another example of the spacer 200 according to the embodiment.

In the drawing, the spiral inductor 204 is formed so that the inductor 204 encloses a plurality of through electrodes 202.

Here, the spiral inductor 204 encloses through electrodes 202 which are not connected to the spiral inductor 204 itself. In this example as, both ends of the spiral inductor 204 are connected to any one of through electrodes 202 even in this example. Here, both ends of the spiral inductor 204 are connected to end of the through electrodes 202 enclosed by the spiral inductor 204.

Even in the embodiment, arrangement of the through electrodes 202, that of the spiral inductors 204, or the shape of the spiral inductor 204 may be configured to be decided in an arbitrary manner.

The embodiments and the examples according to the present invention have been described, referring to the drawings, but the above-described embodiments and examples are to be considered as illustrative and not restrictive. Various kinds of modifications except the above-described embodiments may be adopted.

It is apparent that the present invention is not limited to the above embodiment, and may be modified and changed without departing from the scope and spirit of the invention.

What is claimed is:

1. A semiconductor device, comprising:
   a semiconductor substrate;
   a multilayered interconnect structure formed on said semiconductor substrate;
   a terminal for flip-chip packaging arranged on the surface of said multilayered interconnect structure; and
   a spiral inductor formed to enclose said terminal for flip-chip packaging, in a plan view, which is not electrically connected with said spiral inductor.

2. The semiconductor device according to claim 1,
   wherein said spiral inductor and terminal for flip-chip packaging are formed in different layers of said multilayered interconnect structure with each other.

3. The semiconductor device according to claim 1,
   wherein said spiral inductor is formed over a plurality of layers of said multilayered interconnect structure.

4. The semiconductor device according to claim 2,
   wherein said spiral inductor is formed over a plurality of layers of said multilayered interconnect structure.

5. The semiconductor device according to claim 1, further comprising a resistance, said spiral inductor being connected to said resistance.

6. The semiconductor device according to claim 2, further comprising a resistance, said spiral inductor being connected to said resistance.

7. The semiconductor device according to claim 1,
   wherein said spiral inductor is provided for peaking by which the gain reduction caused in a high frequency is compensated.

8. The semiconductor device according to claim 2,
   wherein said spiral inductor is provided for peaking by which the gain reduction caused in a high frequency is compensated.

9. The semiconductor device according to claim 1,
   wherein said terminal for flip-chip packaging is connected to a connection structure including a plurality of interconnects and vias alternately connected with each other and formed over a plurality of layers of said multilayered interconnect structure.

10. The semiconductor device according to claim 2,
    wherein said terminal for flip-chip packaging is connected to a connection structure including a plurality of interconnects and vias alternately connected with each other and formed over a plurality of layers of said multilayered interconnect structure.

11. A circuit board, comprising:
    a substrate;
    a terminal for flip-chip packaging arranged on the surface of said substrate; and
    a spiral inductor formed to enclose said terminal for flip-chip packaging, in a plan view, which is not electrically connected with said spiral inductor.

12. The circuit board according to claim 11, further comprising a plurality of terminals for flip-chip packaging including said terminal for flip-chip packaging which is enclosed by said spiral inductor, wherein said plurality of terminals for flip-chip packaging are arranged on the surface of said substrate in a plan view.

13. The circuit board according to claim 12, further comprising a plurality of spiral inductors formed so that each of said plurality of spiral inductors encloses at least one of said terminals for flip-chip packaging in a plan view.

14. The circuit board according to claims 11,
    said spiral inductor is provided for peaking by which the gain reduction caused in a high frequency is compensated.

15. The circuit board according to claims 12,
    said spiral inductor is provided for peaking by which the gain reduction caused in a high frequency is compensated.

16. The circuit board according to claims 13,
    said spiral inductor is provided for peaking by which the gain reduction caused in a high frequency is compensated.

17. The circuit board according to claim 11, wherein a plurality of through electrodes are provided in said substrate and one end of each of which is serves as said terminal for flip-chip packaging, said spiral inductor being connected to one of said through electrodes.

18. A semiconductor device, comprising:
    a semiconductor substrate;
    a first multilayered interconnect structure formed on said semiconductor substrate;
    a terminal for flip-chip packaging arranged on the surface of, and electrically connected to, said first multilayered interconnect structure; and
    a spiral inductor formed to enclose said terminal for flip-chip packaging, in a plan view, said spiral inductor not being electrically connected to said terminal and said first multilayered interconnect structure.

19. The semiconductor device according to claim 18, wherein said spiral inductor is formed over, and electrically connected to, a second multilayered interconnect structure that is not electrically connected to said first multilayered interconnect structure.

20. The semiconductor device according to claim 19, further comprising a resistance, said spiral inductor being connected to said resistance through said second multilayered interconnect structure.

* * * * *

UNITED STATES PATENT AND TRADEMARK OFFICE
CERTIFICATE OF CORRECTION

PATENT NO. : 7,619,296 B2  
APPLICATION NO. : 11/340682  
DATED : November 17, 2009  
INVENTOR(S) : Yasutaka Nakashiba It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 669 days.

Signed and Sealed this

Fourteenth Day of December, 2010

David J. Kappos  
*Director of the United States Patent and Trademark Office*